United States Patent [19]

Adachi et al.

[11] Patent Number: 5,152,219

[45] Date of Patent: Oct. 6, 1992

[54] SCREEN PROCESS PRINTING APPARATUS USING A SCREEN REINFORCED BY STRIPS

[75] Inventors: Hideki Adachi; Makoto Sawada; Mokuhei Hashimoto; Hirofumi Shimizu; Jiro Ono; Syunsuke Takagi; Takayuki Umaba; Koichi Mukaegaki; Tsuruo Matsumoto; Tetsu Takahashi, all of Kyoto, Japan

[73] Assignee: Dainippon Screen Mfg., Ltd., Japan

[21] Appl. No.: 827,471

[22] Filed: Jan. 29, 1992

Related U.S. Application Data

[63] Continuation of Ser. No. 418,839, Oct. 10, 1989, abandoned.

[30] Foreign Application Priority Data

Oct. 11, 1988 [JP] Japan .............................. 63-132690
Jun. 26, 1989 [JP] Japan .............................. 1-163423

[51] Int. Cl.⁵ .............................................. B41F 15/36
[52] U.S. Cl. ................................. 101/123; 101/127; 101/127.1
[58] Field of Search ............... 101/114, 121, 122, 123, 101/126, 127, 127.1, 128.1, 129

[56] References Cited

U.S. PATENT DOCUMENTS

| | | | |
|---|---|---|---|
| 2,018,989 | 10/1935 | Wulf | 101/129 X |
| 2,728,294 | 12/1955 | Kälin | 101/126 X |
| 2,998,630 | 9/1961 | Estephanian | 101/126 X |
| 3,244,093 | 4/1966 | Vasilantone | 101/126 |
| 3,303,777 | 2/1967 | Feier et al. | 101/126 X |
| 3,477,574 | 11/1969 | Malfroy | 101/127.1 X |
| 3,769,908 | 11/1973 | Griffin | 101/127 |
| 4,520,727 | 6/1985 | Miller | 101/127 |
| 4,549,484 | 10/1985 | Neese | 101/126 X |
| 4,854,229 | 8/1989 | Vassiliou | 101/123 |
| 4,967,655 | 11/1990 | Holderegger et al. | 101/128.1 |

FOREIGN PATENT DOCUMENTS

| | | | |
|---|---|---|---|
| 2531549 | 1/1977 | Fed. Rep. of Germany | 101/127 |
| 55-1894 | 1/1980 | Japan . | |
| 59-081 | 4/1983 | Japan . | |
| 62-286744 | 12/1987 | Japan . | |

Primary Examiner—Clifford D. Crowder
Attorney, Agent, or Firm—Ostrolenk, Faber, Gerb & Soffen

[57] ABSTRACT

A printing apparatus including: a screen having a printing plate portion and reinforcing strips formed on both sides of the printing plate portion; a stretching device for stretching the screen by applying a predetermined tension thereto in a longitudinal direction of the strips; a squeegee for sliding on the screen in the same direction as the longitudinal direction of the strips, thereby transferring ink onto a surface subjected to printing; and a support table for supporting a material subjected to printing. The squeegee has a width larger than the minimum spacing of the strips on both sides of the printing plate portion. When the squeegee slides on the screen, it presses the printing plate portion and the strips on both sides simultaneously. In printing, the portion of the screen in contact with the surface subjected to printing is maintained flat in the transverse direction. A stretching amount of the screen in the moving direction of the squeegee is equal to a stretching amount of each strip. The screen is not damaged by deformation.

18 Claims, 11 Drawing Sheets

SCREEN PROCESS PRINTING APPARATUS USING A SCREEN REINFORCED BY STRIPS

This is a continuation of application Ser. No. 07/418,839 filed on Oct. 10, 1989 now abandoned.

BACKGROUND OF THE INVENTION

1. Field of the Invention

The present invention relates to a screen process printing apparatus for fabricating printed circuit boards, hybrid circuits, etc. In particular, the present invention relates to a screen process printing apparatus with a screen which is reinforced by a plurality of strips.

2. Description of the Related Art

A plate for use in screen process printing is prepared by forming figures or patterns consisting of openings and non-open portions on a screen which is stretched on a screen frame. The figures or patterns are formed mainly by a photomechanical process. Printing liquid (such as printing paste, printing ink, etc.) is put on the plate. A squeegee is pressed against and slid over the surface of the screen. This causes the ink to be squeezed out from the openings such that the figures or patterns are transferred or printed onto a surface of a material which is placed under the screen.

Figure 2:
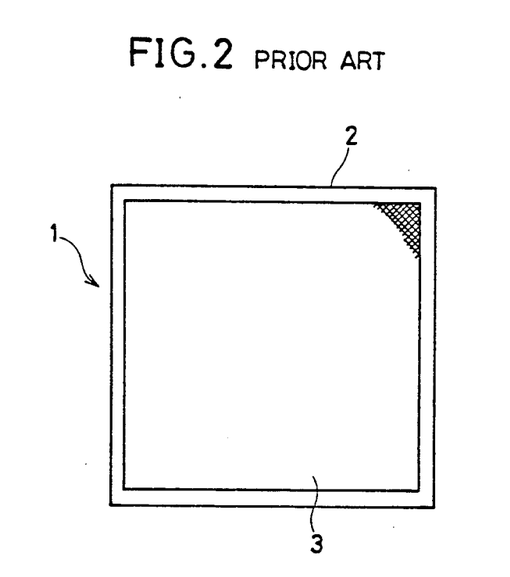
FIG. 2 is a plan view of a conventional screen and a screen frame thereof.

Referring to FIG. 2, a screen frame 1 includes a rectangular frame body 2 of wood or metal, and a screen 3 which is attached to the frame body 2. The four sides of the screen 3 are fixed to the frame body 2 with a prescribed tension by adhesives or the like.

Figure 1:
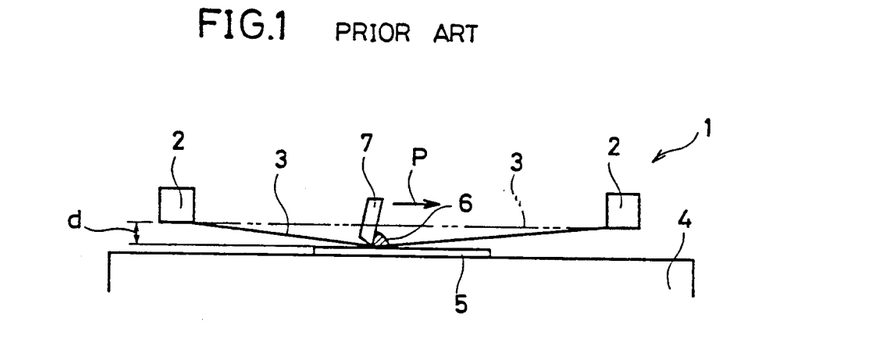
FIG. 1 is a side view schematically showing a main part of a screen process printing apparatus.

Referring to FIG. 1, when printing is to be carried out, a material 5 to be printed is placed on a printing table 4 (by vacuum contact or other method). The frame body 2 is fixed such that a gap d exists between the material 5 and the screen 3. The screen frame 1 is set in the main body of a printing apparatus. The screen 3 is stretched horizontally as shown by the chain line. Ink 6 is applied to the screen 3. The screen 3 is pressed and bent by the squeegee 7 so that the screen 3 contacts the surface of the material 5. The screen 3 is stretched as shown by the solid lines. While the squeegee 7 moves in the direction shown by the arrow P, the ink 6 is transferred onto the material 5 through the openings in the screen 3. As the squeegee 7 advances, the position of contact between the screen 3 and the material 5 moves. The screen 3 adheres to the material 5 at the contact position due to viscosity of the ink. However, when the squeegee 7 moves further, the tension of the screen 3 causes the screen 3 to separate from the material 5. This phenomenon is called snapping off.

Japanese Patent Applications 63-108312 and 63-110856 relate to improving the snapping-off characteristics of a screen frame. The applications also relate to means for prolonging the life of a screen. The applications disclose a screen frame in which a screen is stretched between a fixed frame and a movable frame which is parallel to the fixed frame. Only two sides of the screen are fixed to the frames. Since the techniques disclosed in the Japanese applications are added to the present invention, specific examples thereof are described in the following with reference to FIGS. 3 to 6.

Figure 3:
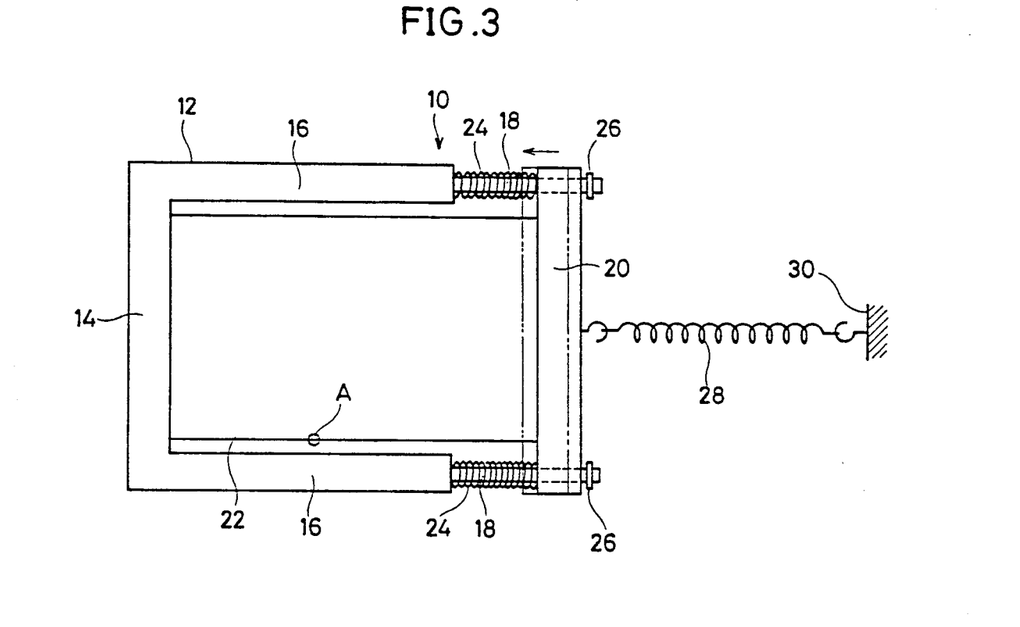
FIGS. 3 to 5 are plan views of a screen and a screen frame of a screen process printing apparatus related to the present invention.

A screen frame 10 shown in FIG. 3 includes a fixed frame body 12. The body 12 includes a mounting frame portion 14 and two side frame portions 16 which are provided at two ends of the mounting frame portion 14. The portions 16 extend perpendicularly with respect to the portion 14. The frame 10 further includes a pair of guide rods 18 which are fixed to the respective side frame portions 16 and a movable frame body 20 which is parallel to the mounting frame portion 14. The movable frame body 20 has through-holes at its two ends. The guide rods 18 are slidably inserted through the through-holes perpendicular to the frame body 20. The frame 10 further includes a pair of compression coil springs 24. The springs 24 are interposed between the ends of the side frame portions 16 and the movable frame body 20.

The guide rods 18 extend from the ends of the side frame portions 16. The rods 18 are parallel to each other and are perpendicular to the mounting frame portion 14. Bearings (not shown) are provided in the movable frame body 20 to enable the movable frame body 20 to move smoothly in slidable contact with the guide rods 18 Stoppers 26 are fixed to the top ends of the rods 18 on the side of the movable frame body 20. The stoppers 26 limit the extent to which the movable frame body 20 can move.

The springs 24 bias the movable frame body 20 away from the fixed frame body 12 so that tension is applied to the screen 22.

The screen 22 is formed of artificial fiber (such as nylon or polyester) or a metallic mesh of stainless steel or the like. The screen can be formed of wirelike portions constituting a mesh in the case of a screen which is formed by a plating method. The wirelike portions can be regarded as wires although such a mesh is not formed by knitting respective wires.

The body 12 is fixed to a base body (by fixation screws or the like) before the frame 10 is mounted in the main body of a printing apparatus. The movable frame body 20 is supported by the rods 18. In some cases, an extension coil spring 28 having one end fixed to a fixed portion 30 of the main body of the printing apparatus may be provided. The other end of the spring 28 is fixed to the movable frame body 20. The spring 28 is used to adjust the tension of the screen when, for example, the force of the springs 24 is insufficient or it is necessary to change the tension of the screen according to requirements of printing quality.

The movable frame body 20 is biased away from the fixed frame body 12 by the springs 24 and the spring 28. The screen 22 is caused to have a predetermined tension. Referring to FIG. 3, the solid lines show the state of the movable frame body 20 and the screen 22 before printing.

Figure 4:
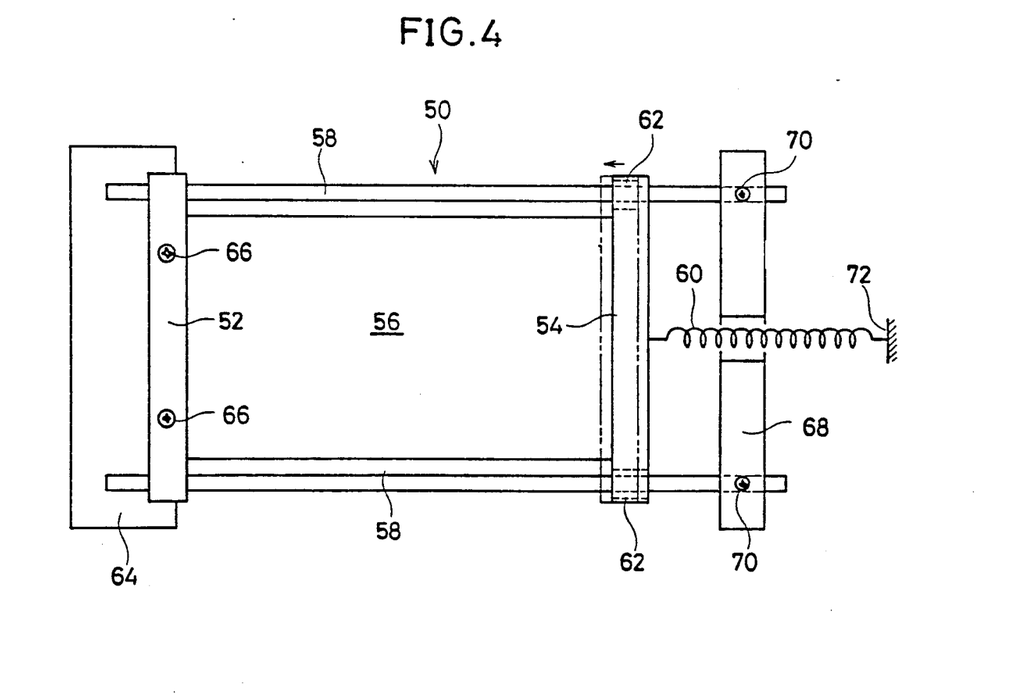

Referring to FIG. 4, a screen frame 50 according to another example comprises a fixed frame body 52 and a movable frame body 54. The bodies 52 and 54 are spaced-apart and parallel. A screen 56 is stretched between the bodies 52 and 54. The frame 50 further includes a pair of guide bars 58 and an extension coil spring 60 which is attached to he movable frame body 54.

The guide bars 58 are parallel to each other. One end of each of the guide bars 58 is inserted into corresponding ends of the fixed frame body 52. Through-holes are provided in the movable frame body 54 and the other ends of the guide bar 58 penetrate through the through-holes. The movable frame body 54 is slidably engaged with the guide bars 58 through bearings 62 so that the body 54 is parallel to the body 52.

The fixed frame body 52 is fixed by fixation screws 66 to a frame holding portion 64 provided in the main body of the printing apparatus. One top end of each of the bars 58 is fixed to the frame body 52. At the same time, the other ends of the bars are fixed by screws 70 to a guide bar holding portion 68 which is also provided in the main body of the printing apparatus. One end of the extension coil spring 60 is fixed to the movable frame body 54 and the other end thereof is fixed to the fixed portion 72. The spring 60 pulls the movable frame body 54 away from the body 52 and applies tension to the screen 56.

Figure 5:
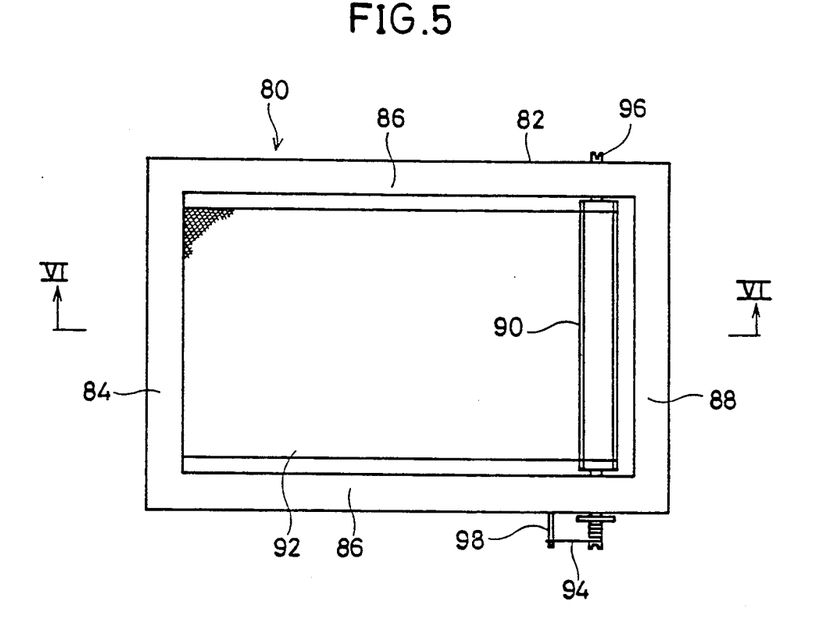
Figure 6:
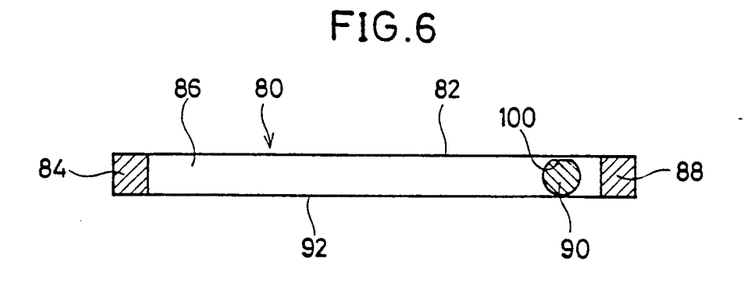
FIG. 6 is a sectional view taken along the direction VI—VI in FIG. 5.

Referring to FIGS. 5 and 6, a screen frame 80 of another example includes a rectangular fixed frame body 82. The body 82 includes mounting frame portion 84, two side frame portions 86 and a coupling frame portion 88. The frame 80 further includes a movable frame body 90 which is located inside of the body 82 and which is spaced apart from and parallel to the mounting frame portion 84. Both ends of the movable frame body 90 are rotatably supported by the side frame portions 86. A torsion coil spring 94 tends to rotate the movable frame body 90 in a counterclockwise direction to apply tension to the screen 92.

The movable frame body 90 is supported by the two side frame portions 86 through a rotating shaft 96. The shaft 96 is fixed to the movable frame body 90 through bearings (not shown) provided in the side frame portions 86. The spring 94 is wound on an outer portion of one end of the rotating shaft 96. One end of the torsion coil spring 94 engages with an engagement pin 98 which is provided in one side frame portion 86. The movable frame portion 90 is a cylindrical body. The portion 90 has a flat surface portion 100 which is formed by cutting along the longitudinal direction of the shaft, as shown in FIG. 6. The screen 92 is fixed to the movable frame body 90 with one side of the screen 92 being attached to the flat surface portion 100 by adhesives or the like.

Figure 7:
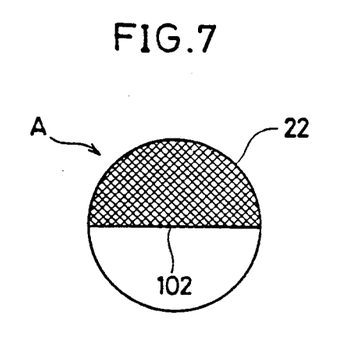
FIG. 7 is a partial enlarged view of FIG. 3.

Bias stretching is normally used to stretch the screen between the frame bodies of FIGS. 3-5. That is, the screen is stretched in such a manner that threads or wires constituting the screen are oblique with respect to the frame bodies. Since the frame bodies are perpendicular to the printing direction, i.e., the running direction of the squeegee, the threads or wires are oblique with respect to the running direction of the squeegee. In a bias stretched screen, some of the threads of the screen 22 end at the edge 102 of the screen 22 and do not extend between the two frame bodies (FIG. 7). As a result, distribution of tension over the whole area of the screen is liable to be uneven.

Figure 8:
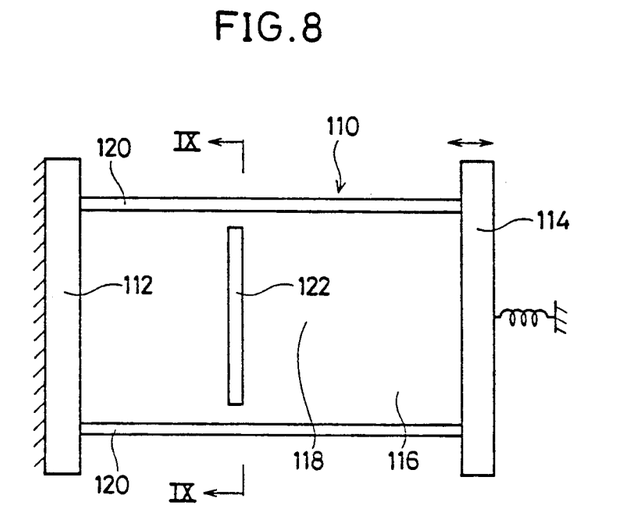
FIG. 8 is a plan view of a screen frame related to the present invention.

To avoid unevenly distributing tension, the screen can be reinforced as illustrated in FIG. 8. Referring to FIG. 8, strips 120 for reinforcing a screen frame 110 are formed on both sides of a screen 116 which is stretched between a fixed frame body 112 and a movable frame body 114 along the printing direction of a squeegee 122. A printing plate portion 118 is between the strips 120. The side edges of the i screen 116 are reinforced by the strips 120. Balancing the distribution of tension throughout the screen permits stable printing to be carried out.

Various reinforcing methods may be considered. In a first method, a photosensitive material is applied to the whole surface of a screen in a manufacturing process of a screen process printing plate and a figure or a pattern is formed in a central portion of the screen by a photomechanical process. During this manufacturing process, two side edges of the screen are reinforced by the photosensitive material remaining on the surface of the screen. The second method is to attach metallic belts to a screen. The third method is to form metallic strips on the surface of a screen by plating.

Figure 9:
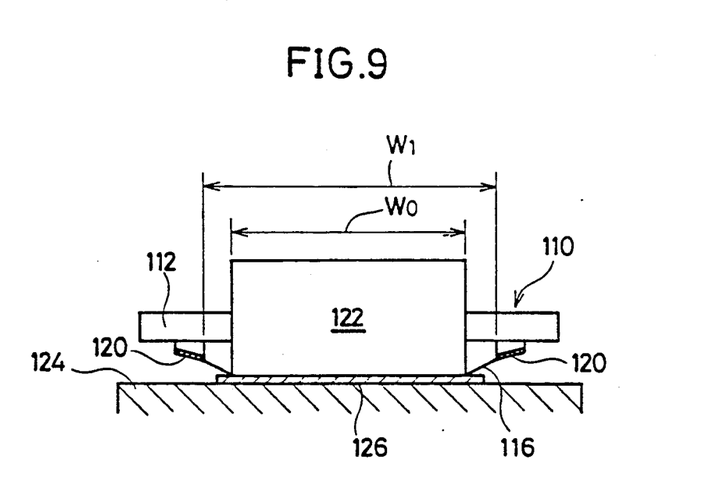
FIG. 9 is a sectional view taken along the line IX—IX in FIG. 8.

However, when the screen frame 110 is used during screen process printing, disadvantages may occur. Referring to FIG. 9, the width W0 of the squeegee 122 is smaller than the width W1 of the screen 116 (corresponding to a dimension between the reinforcing strips 120) (W0<W1). The center of the squeegee 122 (in the widthwise direction) substantially coincides with the center of the screen 116 (in the widthwise direction) at the time of printing.

The reinforcing strips 120 and other portions (including the printing plate portion 118) tend to stretch differently in the squeegee running direction even when the same tension is applied thereto. An excess of force is applied to the screen 116 at the junctions between the reinforcing strips 20 and the other portions of the screen 116. The screen 16 is bent at these junctions. This causes disadvantages such as breakage of the screen 116. Such disadvantages are especially liable to occur if the strips 120 are formed by plating metallic strips on the screen 116, or if the reinforcing strips 120 are formed simultaneously with preparation of the screen by plating.

SUMMARY OF THE INVENTION

Therefore, an object of the present invention is to operate a printing apparatus without exerting any adverse effect on a screen when the screen has reinforcing strips formed on both sides thereof along a moving direction of a squeegee and a printing plate portion is located between the reinforcing strips.

The present invention relates to a printing apparatus, including: a screen having a main portion and longitudinal edges, the main portion including openings therein which correspond to a pattern; reinforcing strips for reinforcing the longitudinal edges of the screen; stretching means for longitudinally stretching the screen; and printing means which includes: (a) a squeegee, (b) means for pressing the squeegee against the screen and for sliding the squeegee across the screen so as to cause ink to flow through the openings to print the pattern on a surface and (c) means for pressing the reinforcing strips toward the surface in cooperation with the pressing of the squeegee against the screen.

The foregoing and other objects, features, aspects and advantages of the present invention will become more apparent from the following description of the present invention when taken in conjunction with the accompanying drawings.

DETAILED DESCRIPTION OF THE PREFERRED EMBODIMENTS

Figure 10:
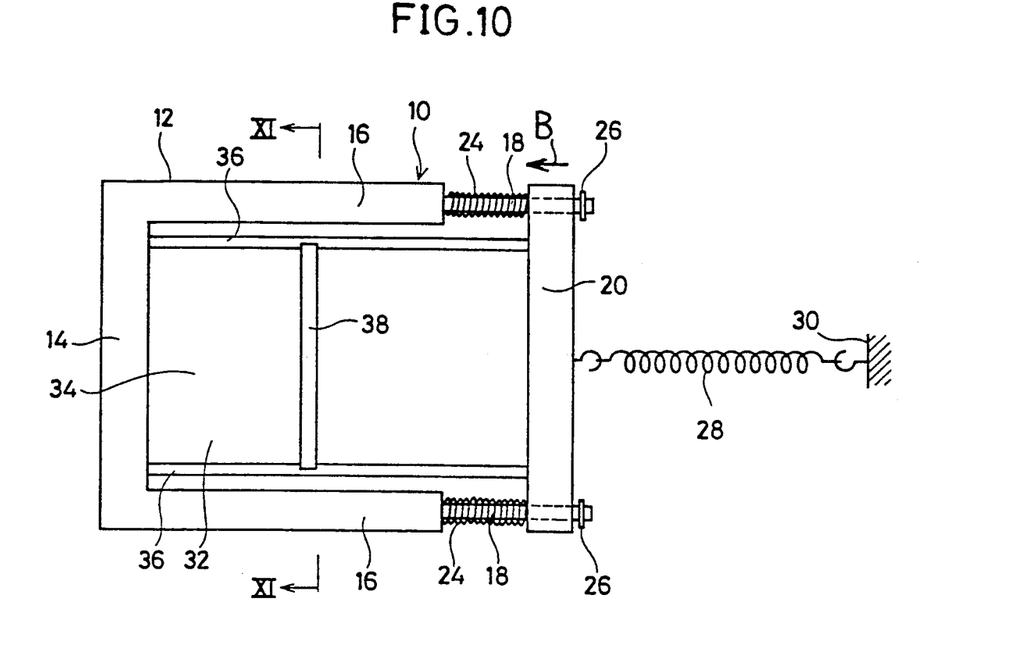
FIG. 10 is a plan view of a screen frame of a screen process printing apparatus according to an embodiment of the present invention.

A screen frame used in a screen process printing apparatus according to the present invention has, in principle, the same structure as shown in FIGS. 3 to 6. In the following description, the screen frame shown in FIG. 3 is taken as an example. Referring to FIG. 10, the same components as those shown in FIG. 3 are denoted by the same reference characters and have the same functions.

The screen frame 10 has a screen 32 which is stretched between a mounting frame portion 14 of a fixed frame body 12 and a movable frame body 20. The screen 32 has reinforcing strips 36 which are formed of photosensitive materials, metallic belts, plated metallic strips, etc. The strips 36 are located at the side edges of the screen 32 and extend along a moving direction of a squeegee 38. The screen 32 has a printing plate portion 34 in its central portion. When the strips 36 are formed of photosensitive material, they are larger in thickness than the printing plate portion 34 of the screen 32. When the strips 36 are formed of metallic belts, plated metallic strips, etc., the width of the strips 36 is equal to, or larger than that of the portion 34.

Figure 11:
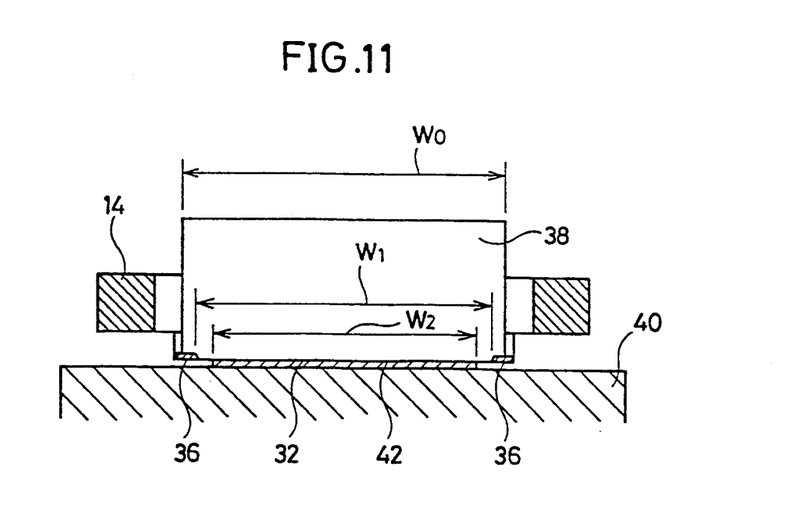
FIG. 11 is a sectional view taken along the direction IX—IX in FIG. 10.

Referring to FIG. 11, the width W0 of the squeegee 38 is larger than a spacing W1 between the strips 36 (W0 > W1). The edge portions of the squeegee 38 simultaneously contact the strips 36 on both sides.

In operation, a material 42 to be printed is placed on a printing table 40. The material 42 may be fixed to the table 40 by, e.g., vacuum contact. The squeegee 38 is moved downward and pressed against the upper surface of the screen 32, and moves straight on the screen 32, while causing it to contact the material 42. The squeegee 38 presses and slides simultaneously on the strips 36 and the surface of the screen 32 (including the printing plate portion 34). The strips 36 and the portion 34 are stretched equally in the running direction of the squeegee 38.

The reason for this is as follows. After the squeegee 38 presses down the strips 36 making contact therewith, the movable frame body 20 is caused to move in the direction B. The strips 36 thus prevent the portion 34 (i.e., the portion of the screen 32 other than the steps 36) from being independently stretched. Accordingly, an excess of force is not applied to the junction between the screen 32 and the strips 36. The screen 32 is not bent and there is no fear of breaking the screen 32 at the junction between the strips 36 and the portion 34.

Such problems do not occur even if the width of the material 42 is larger than that shown in FIG. 11, i.e., even if the strips 36 contact the material 42.

A plurality of strips other than the strips 36 may be formed in portions other than the printing plate portion. In such a case, the length of the squeegee 38 in the longitudinal direction may be set to enable the squeegee 38 to contact simultaneously at least a pair of strips between which the printing plate portion is provided.

Figure 12:
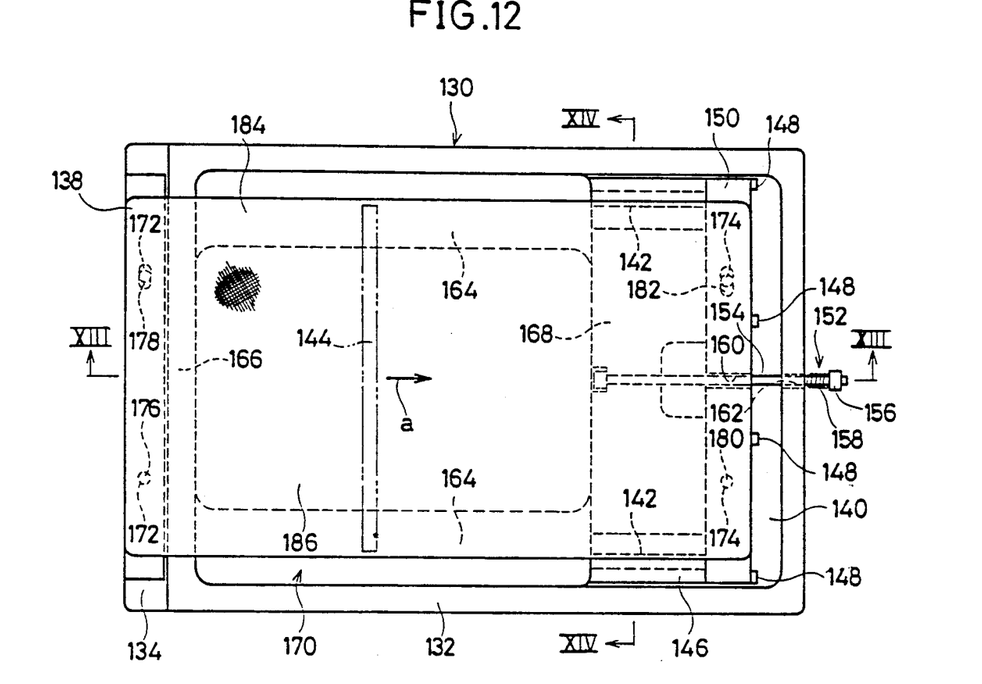
FIG. 12 is a plan view of a screen and a screen frame according to another embodiment of the present invention.
Figure 13:
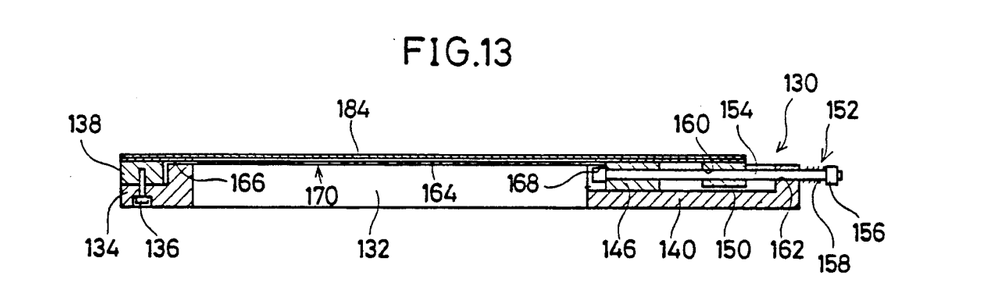
FIG. 13 is a sectional view taken along the direction XIII—XIII in FIG. 12.
Figure 14:
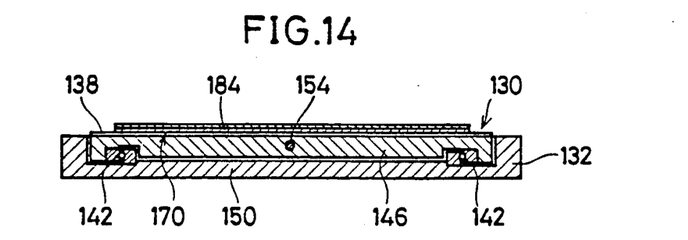
FIG. 14 is a sectional view taken along the direction XIV—XIV in FIG. 12.

Referring to FIGS. 12 to 14, a screen frame 130 comprises a rectangular holding frame body 132. A step portion 134 is formed outside one end of the frame body 132 and a guide plate portion 140 is formed inside of the other end of the frame body 132. The screen frame 130 further includes a fixed frame body 138 which is fixed to the step portion 134 by a fixation screw 136; and a movable frame body 146 engaging with the guide plate portion 140 through a sliding bearing 142. The body 146 is supported by the guide plate portion 140. The body 146 can be moved forward and backward in a running direction a of the squeegee 140. The body 146 is always parallel with the fixed frame body 138. A mounting portion 150 is fixed to the movable frame body 146 by a fixation screw 148. The frame 130 also includes a biasing device 152 for biasing the movable frame body 146 away from the fixed frame body 138.

The biasing device 152 comprises a stud 154 which is inserted and slides through a hole 160 formed in the mounting portion 150 and through a hole 162 provided in the holding frame body 132. One end of the stud 154 is fixed to the movable frame body 146. The other end of the stud projects from the outer side surface of the holding frame body 132. A tension regulating screw 156 engages with a screw portion formed around the stud 154. A compression coil spring 158 is provided between the outer side surface of the holding frame body 132 and the regulating screw 156 in the other end portion of the stud 154.

Between the fixed frame body 138 and the mounting portion 150, there is provided a holding member 170. The member 170 is in the form of a thin plate. The holding member 170 has a pair of holding thin plate portions 164 which are parallel to the running direction a of the squeegee 144. The holding member 170 also has mounting portions 166, 168 provided on both ends thereof. The mounting portions 166, 168 are fixed on the upper surfaces of the fixed frame body 138 and the mounting portion 150 by adhesives or the like.

The material of the holding member 170 is flexible but not expandable or contractible. The material may be formed for example of stainless steel or a plastic plate of about 0.1 to 0.2 mm in thickness. When a pressing force is applied to the holding thin plate portions 164 by the squeegee 144, the movable frame body 146 moves in the direction opposite to the direction a. As a result, the holding thin plate portions 164 are easily curved toward the surface to be printed.

The portions 164 are spaced apart so that the ends of the squeegee 144 simultaneously contact both of the portions 164. Pin holes 172 and 174 for registration are provided in the fixed frame body 138 and the mounting portion 150. A round hold 176 and an elongate hole 178 for registration are provided in the mounting portion 166. A round hole 180 and an elongate hold 182 for registration are provided in the mounting portion 168. The holding member 170 is positioned with respect to the fixed frame body 138 and the movable frame body 146 by using the registration holes. The positioned holding member 170 is fixed to the fixed frame body 138 and the mounting portion 150.

A rectangular screen 184 is attached to the fixed frame body 138 and the mounting portion 150 through the pair of holding thin plate portions 164 and the mounting portions 166 and 168 of the holding member 170, with the four sides of the screen 184 being fixed. A printing pattern is formed in a central portion 186 which does not overlap with the holding member 170.

The screen 184 is fixedly attached to the holding member 170 by adhesives or other means. The portions 164 serve as strips for reinforcing the screen 184. The central portion 186 of the screen 184 serves as a printing plate portion.

The portions 164 are caused to have a prescribed tension T0 by regulation of the tension regulating screw 156. The prescribed tension T0 is defined by characteristics of the material of the holding member 170 and so on. The tension T0 may be approximately 10 kg/cm.

After the prescribed tension T0 is applied to the portions 164, the screen 184 is attached to the holding member 170. The screen 184 is given a tension T1. The tension T1 is smaller than the tension T0 (T1<T0). For example, the tension T1 may be approximately 0.5 to 1 kg/cm.

Referring now to FIG. 12, in operation, the squeegee 144 is positioned so that its two ends are on the two thin plate portions 164. As in the prior art, the lower end of the squeegee 144 is pressed against the screen 184 and the slides thereon.

Since the screen is integrally attached to the holding member 170, the stretching of the screen 184 along the running direction a of the squeegee 144 is regulated by the portions 164.

The pressing force of the squeegee 144 pulls the movable frame body 146 and the mounting portion 150 toward the fixed frame body 138 against the force of the compression coil spring 158. The portions 164 are flexibly curved toward the surface to be printed. The screen 184 is curved toward the surface to be printed together with the portions 164 and contacts the surface to be printed. The screen 184 is not stretched in the printing direction. A snapping off tension is applied to the screen 184 after the passage of the squeegee 144 by the portions 164 and the biasing device 152.

If the spacing W1 between the strips 36 of the screen 32 is larger than the width W2 of the material 42 to be printed (W1>W2), as shown in FIG. 11, the screen 32 is pressed against the two side edge portions of the material 42. At these points, the two side portions of the screen 32 are curved slightly toward the printing table 40. As a result, the screen 32 may be damaged by the edge portions of the material 42. An example of means for preventing such damage is shown in FIGS. 15 to 17.

Figure 15:
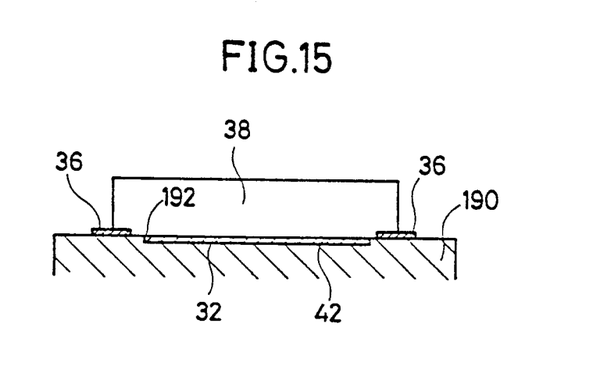
FIGS. 15 to 17 are sectional views of a main part of a screen printing apparatus according to further embodiments of the invention.

Referring to FIG. 15, an improved screen process printing apparatus comprises a printing table 190 with a recessed portion 192. The material 42 is placed in the portion 192. The portion 192 is recessed by a dimension corresponding to the thickness of the material 42. Thus, when the squeegee 38 presses the screen 32 and the strips 36, the upper surface of the material 42 substantially coincides with the upper surface of the printing table 190. This prevents the screen 32 from being curved at the edge portions of the material 42 such that the screen 32 is hardly damaged by the squeegee 38.

Figure 16:
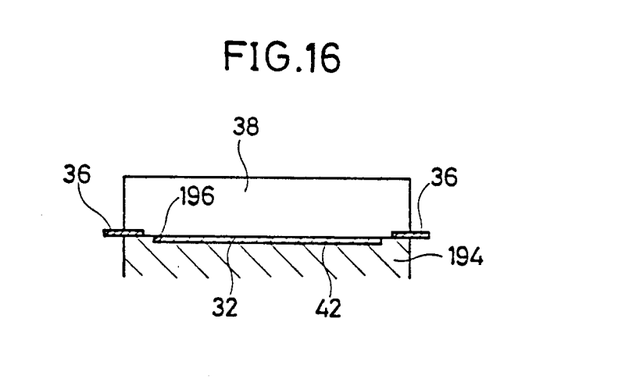

In the embodiment illustrated in FIG. 16, a printing table 194 has a width substantially equal to the length of the squeegee 38. (The width of the printing table 190 is greater than the length of the squeegee 38.) A recessed portion having a depth equal to the thickness of the material 42 is formed on the printing table 194. The embodiment of FIG. 16 is otherwise the same as that of FIG. 15.

Figure 17:
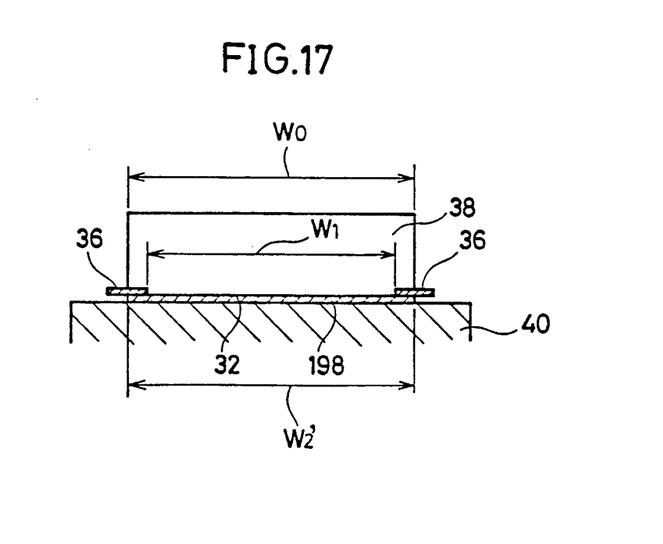

In the embodiment illustrated in FIG. 17, the spacing W1 of the strips 36 is smaller than the width W2' of the material 198 to be printed. The two edges of the material 198 contact the lower surfaces of the strips 36. The edges of the material 198 may extend outside the strips 36. Accordingly, there is no possibility that portions other than the strips 36 of the screen 32 might be pressed strongly against the edge portions of the material 198 by the pressing of the squeegee 38 against the screen 32.

Figure 18:
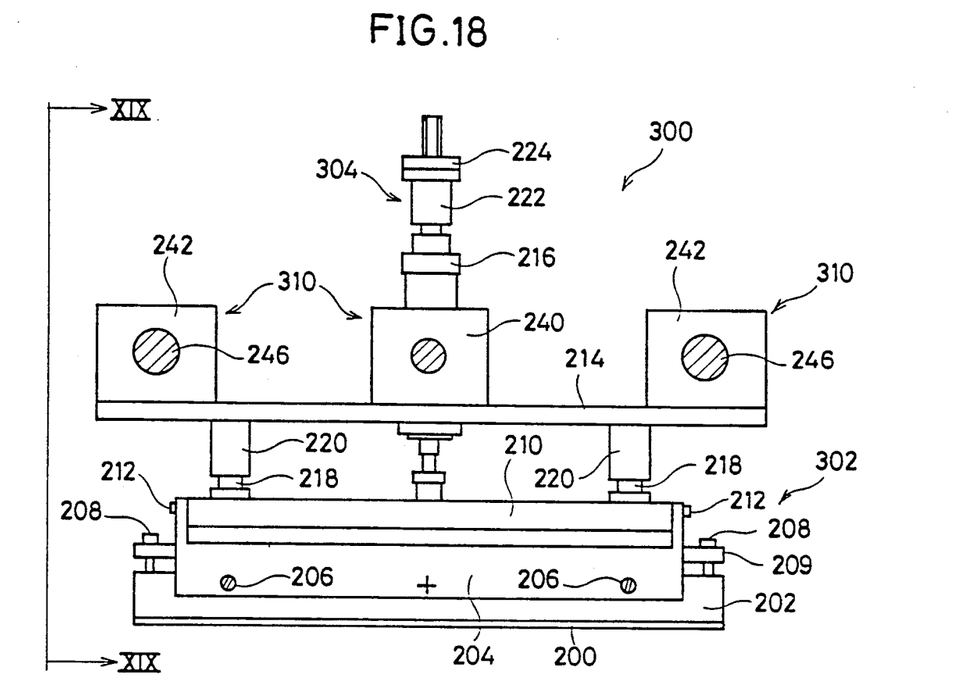
FIG. 18 is a front view of a squeegee head.
Figure 19:
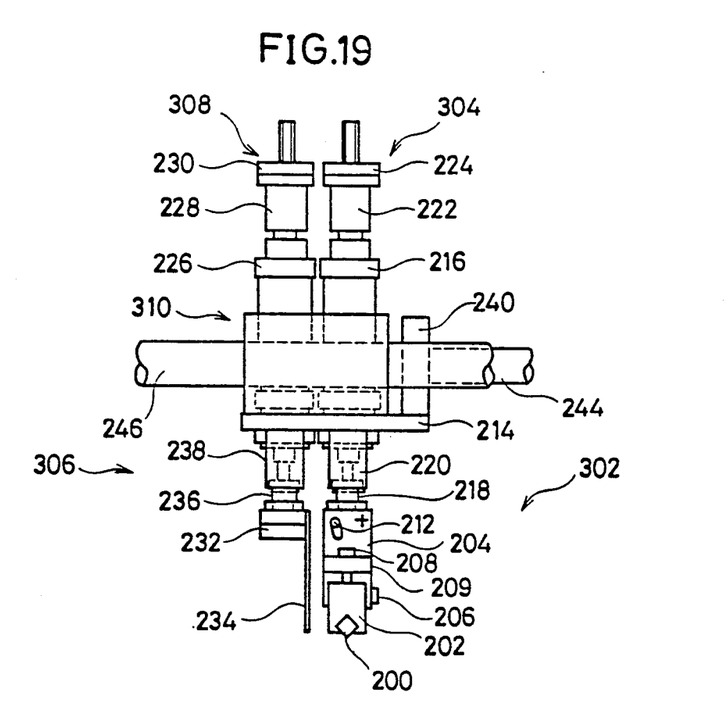
FIG. 19 is a sectional view taken along the direction XIX—XIX in FIG. 18.

Referring to FIGS. 18 and 19, a specified example of a squeegee holder used in an apparatus according to the present invention will be described. A squeegee 200 used in this example is an angular squeegee. However, this is shown only by way of example. The squeegee 200 may be flat or have other forms.

A squeegee holder 300 comprises: a holding plate 214; a squeegee holding unit 302 provided under the holding plate 214 for holding the squeegee 200 with its top edge parallel to the surface to be printed; a squeegee elevating unit 304 for vertically moving the squeegee holding unit 302 with respect to the holding plate 214; and a scraper attaching unit 306 provided in the rear of the squeegee holding unit 302 under the holding plate 214. The unit 306 holds a scraper 234 which is used to return ink on the screen to a printing start position each time one printing operation is completed. The holder 300 further includes elevating unit 308 which is provided over the holding plate 214. The unit 308 moves the scraper attaching unit 306 vertically with respect to the holding plate 214. The holder 300 further includes a squeegee head guide unit 310 provided on the holding plate 214, for moving the squeegee head 300 along the printing direction.

The squeegee elevating unit 304 includes a squeegee elevation drive cylinder 216 and a vertical stroke regulation screw 220. The cylinder 216 is fixed on the holding plate 214. The screw 220 has a locknut 224 which is provided on the cylinder 216.

A pair of slide bearings 220 (to which the squeegee holding unit 302 is attached) and a pair of slide bearings 238 (to which the scraper holding unit 306 is attached) are provided near both ends of the lower surface of the holding plate 214.

The squeegee holding unit 302 includes a squeegee elevating plate 210 having a pair of elevating shafts 218 at both ends thereof The elevating shafts 218 slidably engage with the slide bearings 238. The central portion of the squeegee elevating plate 210 is fixed to a piston rod of the cylinder 216. The unit 302 further includes a squeegee mounting plate 204 which is fixed to the squeegee elevating plate 210 by a pair of fixing screws 212; and a squeegee holding member 202 attached to the squeegee mounting plate 204 by screws 206, for holding the squeegee 200. Squeegee parallel adjustment members 209 having female screw portions are provided in both ends of the squeegee mounting plate 204. Regulation screws 208 keep the squeegee parallel to the upper surface of the printing table.

The scraper elevating unit 308 includes a scraper elevation drive cylinder 226 for vertically driving the scraper holding unit 306. A scraper vertical stroke regulation screw 228 and a locknut 230 are provided on the upper end of the cylinder 226.

The scraper holding unit 306 includes a scraper attaching plate 232 having a pair of elevating shafts 236 in both end portions thereof. The respective elevating shafts 236 are slidably engageable with the vertical movement bearings 238. The scraper attaching plate 232 is coupled to a piston rod of the scraper elevation drive cylinder 226. The scraper 234 is attached to the scraper attaching plate 232.

The squeegee head guide unit 310 includes an actuator coupler plate 240 provided in the center on the holding plate 214, an operation shaft 244 of an actuator (such as a cylinder) being coupled to the actuator coupler plate 240; and a pair of bearing holders 242 provided in both ends on the holding plate 214, a slide shaft 246 being slidably engaged with each bearing holder 242. When the actuator is operated, the whole body of the squeegee head 300 moves in the printing direction and at the same time parallel to the material subjected to printing.

The shape of the squeegee 200 and the hardness of the rubber squeegee 200 are determined by transfer quality of printing ink onto the material subjected to printing. For instance, the most suitable value out of 50°, 60°, 70°, 80° is selected as the rubber hardness It is to be noted that the stiffness, and the like of the strips of the screen and those of the portions where the printing plate is formed are different. In some cases, the hardness of the squeegee is set relatively low taking into account the quality of ink transfer onto the material to be printed, i.e., the printing quality. In those cases, the pressing of the squeegee on the strips of the screen becomes unstable because of the above-mentioned differences. In addition, the running of the squeegee may be unstable due to friction caused by the sliding of the In addition, the running of the squeegee may be large coefficient of friction). The movable frame body shown in FIGS. 12 to 14 might not move smoothly.

A plurality of embodiments for practicing the present invention most appropriately, by avoiding the above-described disadvantages, will be described in the following with references to FIGS. 20 to 24.

Figure 20:
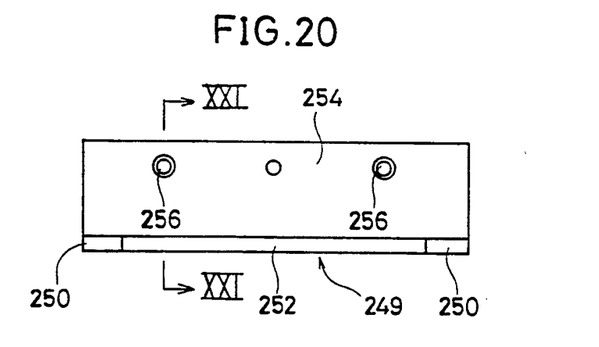
FIG. 20 is a front view of a squeegee and a squeegee holder plate of a screen process printing apparatus according to an embodiment of the present invention.
Figure 21:
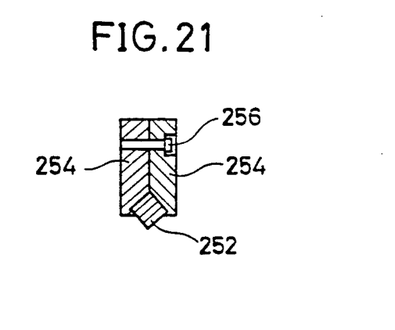
FIG. 21 is a sectional view taken along the direction XXI—XXI in FIG. 20.

Referring to FIGS. 20 and 21, a squeegee 249 comprises a pair of side squeegees 250 which are adapted to slide on the strips of the screen, and a center squeegee 252 which is adapted to slide on the surface of the screen between the strips. The side squeegees 250 and the center squeegee 252 are held by a pair of common squeegee holders 254. The two squeegee holders 254 are pressed into contact with each other by clamp screws 256, whereby the squeegees 250 and 252 are fixed to the squeegee holders 254.

The side squeegees 250 and the center squeegee 252 are formed by rubber materials having different hardnesses. For instance, the side squeegees 250 may have a hardness of 80° whereas the center squeegee 252 may have a hardness of 60°. The sliding conditions of the squeegees for the respective portions of the screen are maintained appropriately. As a result, the squeegee 249 can stably slide in contact with the screen.

In the above-mentioned case, the side squeegees 250 and the center squeegee 252 are all formed of rubber. However, they may be formed of different materials. For instance, the side squeegees 250 may preferably be formed of a fluororesin such as polytetrafluoroethylene (which has a small coefficient of friction). In this case, the normal use of the printing liquid to lubricate the strips of the screen can be advantageously dispensed with (particularly when avoidance of the soil of the liquid to any place such as the printing table, etc. is absolutely desired).

It is noted that if the side squeegees 250 and the center squeegee 252 are formed with the respective lower ends thereof in a straight line, the following significant problem might occur. Usually, it is necessary to determine the force at which the squeegee is pressed against the printing plate portion of the screen and the surface subjected to printing, on the basis of both a prescribed pressure and on the basis of the extent to which the rubber receiving that pressure will deform. The deformation of the screen rubber is ordinarily set larger than the unevenness of the surface to be printed (or upper surface of the printing table). However, when the side squeegee is formed of fluororesin (which is less deformable than rubber), it is practically impossible to set the pressing force which ensures the appropriate deformation of the center squeegee. A further embodiment of the invention which overcomes this problem will be described in the following.

Figure 22:
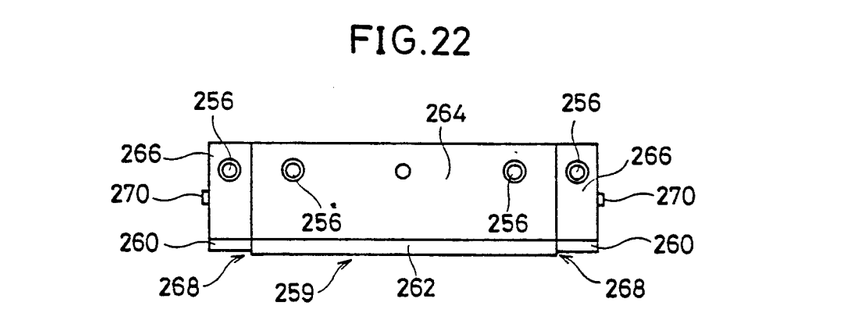
FIGS. 22 to 26 are front views of a squeegee and a squeegee holder according to further embodiments of the invention.
Figure 23:
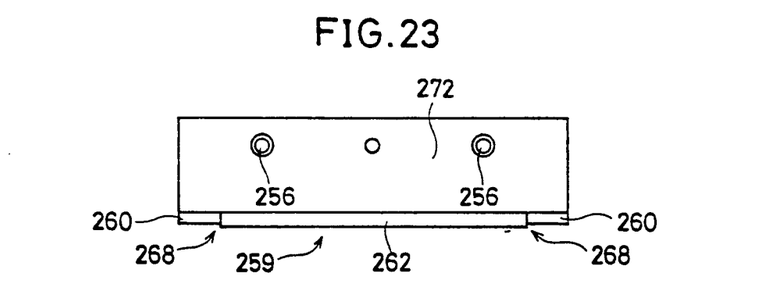

Referring to FIGS. 22 and 23, a squeegee 259 comprises a pair of side squeegees 260 provided on both sides and adapted to slide on the strips of the screen, and a center squeegee 262.

The side squeegees 260 are held by side squeegee holders 266. The center squeegee 262 is held by a center squeegee holder 264. Both of the side squeegee holders 266 are fixed to the center squeegee holder 264 by fixation screws 270. Each squeegee holder 266 and 264 is formed by two members in the same manner as that in the squeegee holder 254 shown in FIG. 21 and those members are fixed to each other by clamp screws 256.

The lower edges of the side squeegees 260 are slightly higher than the lower edge of the center squeegee 262. The resulting level difference 268 takes into account the pressure to be applied to the squeegee, the thickness of the strips of the screen and so on. If the level difference 268 is suitably selected, printing is carried out stably with an appropriate squeegee pressure.

The squeegee 259 shown in FIG. 23 has the same structure and the same advantages as the squeegee shown in FIG. 22. The apparatus shown in FIG. 23 is different from the apparatus shown in FIG. 22 in that the squeegees 260 and 262 are held by a common squeegee holder 272. The squeegee holder 272 is also formed by a pair of members integrally combined by the clamp screws 256.

The apparatus shown in FIG. 22 is characterized in that the respective squeegees 260 and 262 can be reliably held. On the other hand, the apparatus shown in FIG. 23 is characterized in that stable printing can be carried out with a simpler structure.

Figure 24:
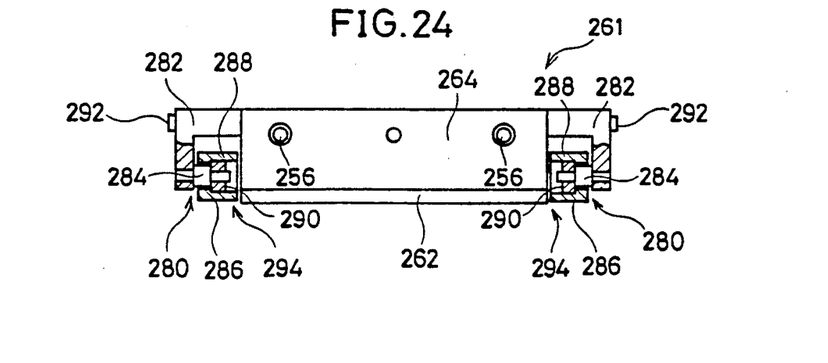

The squeegee holding unit 261 illustrated in FIG. 24 includes a center squeegee holder 264 for holding a center squeegee 262, and a pair of side squeegees 280 provided on both ends of the center squeegee holder 264.

The center squeegee holder 264 includes a pair of members which are fixed by clamp screws 256, the center squeegee 262 being held between the pair of members.

Each of the side squeegees 280 includes a reverse L-shaped side squeegee holder 282 fixed at an end of the center squeegee holder 264 by a fixation screw 292, a support shaft 284 having one end inserted and fixed in a hole formed in a top end of the side squeegee holder 282, and a rotable roller 286 supported by the support shaft 284. A bearing 288 is pressed into each roller 286, so as to rotatably hold the roller 286 by contacting the circumference of the support shaft 284. Each bearing 288 is attached to the corresponding support shaft 284 by a snap ring 290.

In operation, the center squeegee 262 slides on the printing plate portion of the screen. As a result, the ink on the screen is transferred onto the material subjected to printing. The rollers 286 roll on the reinforcing strips while pressing the strips. Thus, stable printing is carried out and the pressure of the squeegee can be maintained appropriately. Since the rollers 286 roll on the strips, the strips will not be damaged by friction. Accordingly, the use of printing liquid as a lubricant for the strips can be dispensed with.

In the case of FIG. 24, a level difference 294 is provided between a lower end of the center squeegee 262 and a lower end of each roller 286. It is not always necessary to provide the level difference 294.

Figure 25:
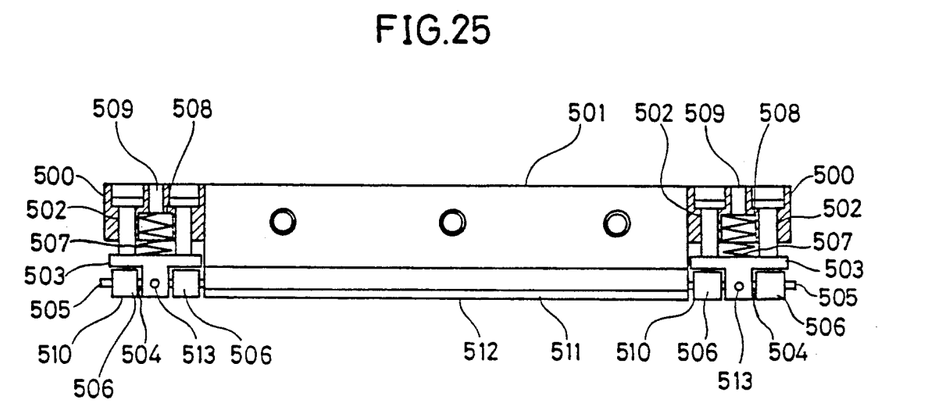

In this connection, a further embodiment for solving the aforementioned problems encountered with the squeegee pressure setting is described with reference to FIG. 25.

Guide blocks 500 are secured on both ends of a squeegee holder 501 by screws (not shown) etc. A pair of guide pins 502 having stoppers are slidably provided in each block 500. The guide pins 502 are screwed on roller mounting blocks 503. Roller shafts 504 are fixed on the blocks 503 by screws 513, and inserted through rollers 506 and secured thereon by fixing screws 505. The blocks 503 are biased downward by springs 507. The force of the springs 507 is adjusted by screws 509 via washers 508. The guide pins 502 are screwed onto the blocks 503. Thus, it is possible to adjust the level difference between the lower edges 510 and the lower edge 512 of the squeegee 511 by vertically moving the guide pins 502.

The rollers 506 are not fixed by the springs 508. It is, therefore, possible to readily render the lower edges 510 and 512 of the rollers 506 and squeegee 511 at the same level. The edge 510 is then free to move vertically and contact the strips in the line with the edge 512.

Naturally, it is also possible to effect any level difference between the edges.

If a set of squeegees is formed by side squeegees and a center squeegee as described above, the center squeegee may slide on part of the reinforcing strips. Conversely, the side squeegees may slide or roll on portions of the screen other than the strips. To prevent damage to the squeegee due to friction in the edge portions of the strips, a gap may be provided between the squeegees, or a cutout portion may be provided between the squeegees.

As illustrated in FIG. 6, the side squeegees and the center squeegee may be formed as separate members and held by different units. If both of the squeegee holding units are moved in a straight line in synchronization with each other, the same effect as in the above-described embodiments can be obtained.

Figure 26:
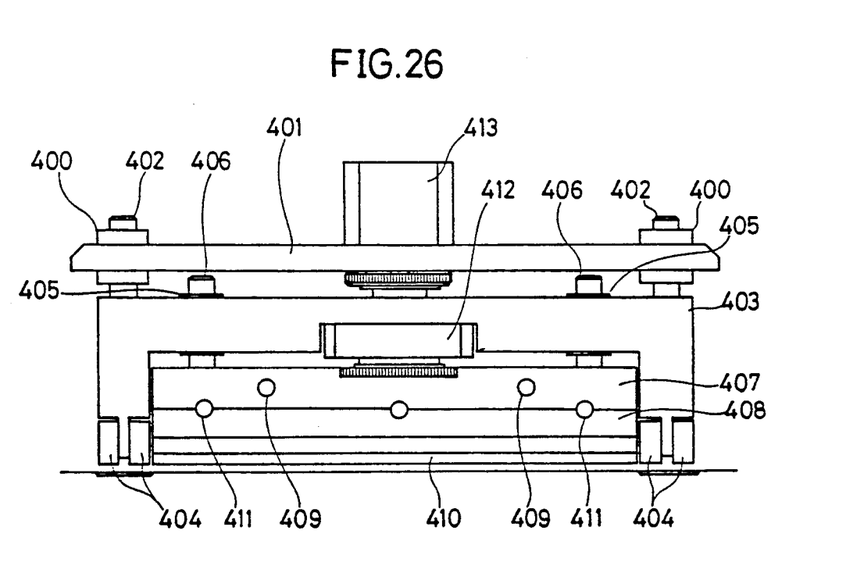

The apparatus illustrated in FIG. 26 has separate units and individual driving mechanisms for the pressing units.

A pair of vertical slide bearings 400 are provided on both end portions of a squeegee head carriage plate 401. A vertical slide shaft 402 is slidably fitted into each of the vertical slide bearings 400. The vertical slide shafts 402 are secured on shoulders of a roller holder 403 by press fitting, etc., extending through the vertical slide bearings 400. Rollers 404 are rotatably mounted on respective top ends of arms of the roller holder 403. A pair of squeegee vertical slide bearings 405 are provided on both sideway portions of the roller holders 403. A squeegee vertical slide shaft 406 is slidably fitted into each of the squeegee vertical slide bearings 405. The squeegee vertical slide shafts 406 are fixed on a center squeegee holder mounting block 407 by press fitting, etc., extending through the vertical slide bearings 405. A center squeegee holder 408 is secured on the block 407 by screws 409. A center squeegee 410 is fixed on the center squeegee holder 408 by screws 411.

An air cylinder 412 is mounted on a center portion of the roller holder 403 by screws (not illustrated). An output shaft of the driving part 412 is connected into the block 407. The vertical stroke cylinder 142 is adjustable by a stroke adjustment screw (not shown). A body of an air cylinder 413 is mounted on a center portion of the squeegee head carriage plate 401 by a screw (not illustrated). An output shaft of the cylinder 413 is connected into the roller holder 403. The vertical stroke of the cylinder 413 is adjustable by a stroke adjustment screw (not shown).

In operation, the center squeegee driving part 412 first vertically moves the center squeegee holder mounting block 407 relative to the roller holder 403 such that lower edges of the center squeegee 410 and the rollers 404 are at their prescribed different levels. Then, the roller driving part 413 is actuated to move the roller holder 403 to lower the center squeegee 410 and the roller 404. As a result, the rollers 404 make contact with the reinforcing strips and the center squeegee 410 makes contact with the printing plate portion of the screen. After the printing plate portion contacts the surface to be printed, the center squeegee 410 alone descends further to obtain the desired final printing quality. Next, printing is conducted by integrally and simultaneously advancing the rollers 410, 404 in the printing direction.

Needless to say, the side squeegees can be replaced by rollers.

The present invention is not limited to the above-described embodiments. For instance, a screen frame may have any structure insofar as a screen having strips for reinforcing on both sides thereof along a printing direction, i.e., a moving direction of a squeegee, is stretched between a pair of frame bodies with a printing plate portion being provided between the strips. The reinforcing strips on the screen may be provided on the surface of the screen facing the material to be printed. The strips need not be on the surface facing the squeegee. Furthermore, the strips may be provided on both surfaces of the screen. The positions of the reinforcing strips on the screen surface are not limited to the edges of the screen. They may be formed in any region except for the region where an effective image is formed.

Figure 27A:
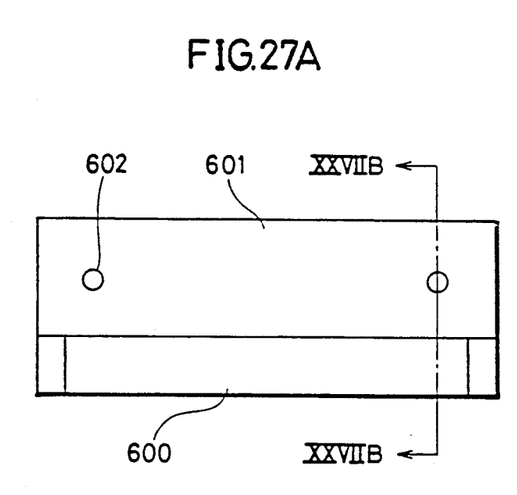
FIG. 27A is a view illustrating another variation of a squeegee.
Figure 27B:
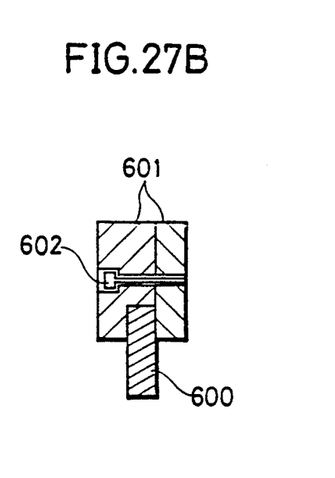
FIG. 27B is a sectional view taken along the direction XXVIIB—XXVIIB in FIG. 27A.

The square squeegees of FIG. 21 can be replaced by other types, such as a plate squeegee 600 shown in FIG. 27. A plate squeegee holder 601 is employed in conjunction with the squeegee 600. In this case, the plate squeegee 600 is fixed on the plate squeegee holder 601 by a screw 602.

Although the present invention has been described and illustrated in detail, it is clearly understand that the same is by way of illustration and example only and is not to be taken by way of limitation. The spirit and scope of the present invention should be limited only by the terms of the appended claims.

We claim:

1. A printing apparatus for forming a predetermined pattern on a surface subjected to printing with a predetermined printing liquid, comprising:

a screen having a first surface and a second surface, the screen including a printing plate portion with openings, said openings corresponding to said pattern, the openings extending from said first surface to said second surface, said printing plate portion preventing printing liquid supplied on said first surface from reaching said second surface except through said openings;

stretching means for stretching said screen with a predetermined tension in a predetermined first direction, said second surface facing said surface subjected to printing, said second surface being substantially arranged in parallel to said surface subjected to printing by a predetermined distance;

moving pressing means which is movable in a predetermined first range in said first direction, said moving pressing means extending over a predetermined second range in a second direction, said second direction intersecting said first direction, said moving pressing means being adapted to move in said first range while pressing said first surface, thereby deforming said screen to cause a pressed portion of said second surface to be in contact with said surface subjected to printing, and thereby pushing liquid on said first surface to said second surface;

said screen having a substantially rectangular shape formed by a first pair of sides which are parallel to said first direction and a second pair of sides which are parallel to said second direction;

said stretching means comprising fixing means for fixing one of the sides of said second pair of sides along said second range; and tension applying means for holding the other side of said second pair of sides along said second range and for causing said other side to move in said first direction away from said fixing means, said tension applying means comprising screen holding means for holding said other side of said second pair of sides along said second range, said screen holding means being movable during movement of said moving pressing means over said first surface in said first direction and in a direction opposite to said first direction against a force provided by said tension applying means;

support means for supporting said surface subjected to printing; and wherein said screen has reinforcing strips for equalizing the tension in said screen, said strips being flexible and being located on said first pair of sides of said printing plate portion, said strips extending in said first direction and being formed at least over said first range in said first direction, said strips being spaced apart from each other in said second direction, the spacing between said strips in said second direction being within said second range, whereby said moving pressing means simultaneously presses against said strips and said printing plate portion while moving in said first range and causes said screen holding means to move in said opposite direction to said first direction against a force provided by said tension applying means such that said screen is curved toward said surface subjected to printing integrally with said strips so as to cause said pressed portion of said second surface to be in contact with said surface subjected to printing.

2. A printing apparatus in accordance with claim 1, wherein said screen has a substantially rectangular shape formed by a first pair of sides which are parallel to said first direction and a second pair of sides which are parallel to said second direction.

3. A printing apparatus in accordance with claim 2, wherein each of said strips has a thickness which is equal to or larger than that of said printing plate portion.

4. A printing apparatus in accordance with claim 1, wherein said moving pressing means includes: (a) first moving pressing means for moving with respect to said printing plate portion while pressing said printing plate portion and (b) second moving pressing means for moving with respect to said strips while pressing said strips.

5. A printing apparatus in accordance with claim 4, wherein said first moving pressing means includes a first squeegee of rubber having a first hardness, said squeegee including a top edge which is parallel to said first surface.

6. A printing apparatus in accordance with claim 5, wherein said second moving pressing means includes a second squeegee of rubber having a second hardness, said second hardness being different from said first hardness.

7. A printing apparatus in accordance with claim 5, wherein said second moving pressing means includes a roller.

8. A printing apparatus in accordance with claim 4, wherein
said top edge of said first moving pressing means is formed nearer to said surface subjected to printing than to a top end of said second moving pressing means.

9. A printing apparatus in accordance with claim 4, further comprising
movement synchronizing means for moving said first moving pressing means and said second moving pressing means in synchronization with each other in said first direction.

10. A printing apparatus in accordance with claim 2, wherein
said tension applying means comprises
screen holding means for holding said other side of said second pair at least along said second range, and
actuating means for actuating said holding means in said first direction to cause said holding means to be away from said fixing means.

11. A printing apparatus in accordance with claim 10, wherein said actuating means includes a compression coil spring provided between said fixing means and said holding means.

12. A printing apparatus in accordance with claim 11, wherein said actuating means further includes an extension coil spring for pulling said holding means away from said screen in said first direction.

13. A printing apparatus in accordance with claim 1, wherein said support means is adapted to support said material subjected to printing on an upper surface of said support means such that the material subjected to printing is substantially horizontal.

14. A printing apparatus in accordance with claim 13, wherein said material subjected to printing has a predetermined first thickness, a predetermined first length along said first direction, and a predetermined first width along said second direction, said support means including a recessed portion having at least the same length as said first length in said first direction, at least the same width as said first width in said second direction, and a first depth equal to said first thickness, whereby a surface of said material subjected to printing is located on the same plane as regions other than said recessed portion on the upper surface of said support means.

15. A printing apparatus in accordance with claim 1, wherein the minimum spacing of said strips is smaller than the width of said material subjected to printing in said second direction.

16. A printing apparatus in accordance with claim 1, wherein said strips are flexible but less expansible or contractible than said printing plate portion.

17. A printing apparatus for forming a predetermined pattern on a surface subjected to printing with a predetermined printing liquid, comprising:

a screen having a first surface and a second surface, the screen including a printing plate portion with openings, said openings corresponding to said pattern, the openings extending from said first surface to said second surface, said printing plate portion preventing printing liquid supplied on said first surface from reaching said second surface except through said openings;

stretching means coupled to frame means for stretching said screen with a predetermined tension in a predetermined first direction, said screen having a first pair of sides extending in said first direction and a second pair of sides extending in a second direction, said second surface facing said surface subjected to printing, said second surface being substantially arranged in parallel to said surface subjected to printing by a predetermined distance;

support means for supporting said surface subjected to printing;

reinforcing strips having lengths extending in the first direction for equalizing the tension in said screen, said strips being flexible, attached to said screen and being located on sides of said printing plate portion extending in said first direction and being spaced apart from each other in the second direction, said reinforcing strips being unconnected along their lengths to said frame means; and moving pressing means extending over said screen in said second direction, and being adapted to move in said first direction while pressing said first surface, said moving pressing means engaging simultaneously both said screen and said reinforcing strips while moving in said first direction thereby integrally deforming said screen and reinforcing strips to cause a pressed portion of said second surface to be in contact with said surface subjected to printing, and thereby pushing liquid on said first surface to said second surface.

18. A printing apparatus in accordance with claim 17, further wherein:

said screen has a substantially rectangular shape formed by said first pair of sides which are parallel to said first direction and said second pair of sides which are parallel to said second direction;

said stretching means comprising fixing means for fixing one of the sides of said second pair of sides along said second direction; and tension applying means for holding the other side of said second pair of sides along said second direction and for causing said other side to move in said first direction away from said fixing means, said tension applying means comprising screen holding means for holding said other side of said second pair of sides along said second direction, and said screen holding means being movable during movement of said moving pressing means over said first surface in said first direction and in a direction opposite to said first direction against a force provided by said tension applying means.

* * * * *